(12) United States Patent
Doudin et al.

(10) Patent No.: US 6,657,888 B1
(45) Date of Patent: Dec. 2, 2003

(54) APPLICATION OF HIGH SPIN POLARIZATION MATERIALS IN TWO TERMINAL NON-VOLATILE BISTABLE MEMORY DEVICES

(75) Inventors: Bernard Doudin, Lincoln, NE (US); Andrei Sokolov, Lincoln, NE (US); Cheol-Soo Yang, Lincoln, NE (US); Lu Yuan, Lincoln, NE (US); Sy-Hwang Liou, Lincoln, NE (US)

(73) Assignee: Board of Regents of the University of Nebraska, Lincoln, NE (US)

( * ) Notice: Subject to any disclaimer, the term of this patent is extended or adjusted under 35 U.S.C. 154(b) by 0 days.

(21) Appl. No.: 10/135,348

(22) Filed: Apr. 30, 2002

Related U.S. Application Data

(60) Provisional application No. 60/290,151, filed on May 11, 2001.

(51) Int. Cl.[7] .......................... G11C 11/00; G11C 11/14
(52) U.S. Cl. .................. 365/158; 365/171; 365/173
(58) Field of Search ................................ 365/158, 171, 365/173

(56) References Cited

U.S. PATENT DOCUMENTS

| | | | |
|---|---|---|---|
| 5,089,991 A | 2/1992 | Matthews | 365/9 |
| 5,629,922 A * | 5/1997 | Moodera et al. | 365/158 |
| 5,650,958 A | 7/1997 | Gallagher et al. | 365/173 |
| 5,757,056 A * | 5/1998 | Chui | 257/421 |
| 5,841,692 A | 11/1998 | Gallagher et al. | 365/173 |
| 5,856,897 A | 1/1999 | Mauri | 360/113 |
| 5,953,248 A | 9/1999 | Chen et al. | 365/158 |
| 5,966,012 A | 10/1999 | Parkin | 324/252 |
| 6,034,887 A * | 3/2000 | Gupta et al. | 365/171 |
| 6,069,820 A | 5/2000 | Inomata et al. | 365/171 |
| 6,166,948 A | 12/2000 | Parkin et al. | 365/173 |
| 6,178,112 B1 | 1/2001 | Bessho et al. | 365/173 |
| 6,215,695 B1 | 4/2001 | Ikeda | 365/158 |
| 6,215,696 B1 | 4/2001 | Tsuge | 365/173 |
| 6,226,160 B1 | 5/2001 | Gallagher et al. | 360/324.2 |
| 6,233,172 B1 | 5/2001 | Chen et al. | 365/173 |
| 2001/0025978 A1 * | 10/2001 | Nakao | 257/314 |

\* cited by examiner

*Primary Examiner*—Son Mai
(74) *Attorney, Agent, or Firm*—James D. Welch (57) ABSTRACT

Disclosed are two terminal bistable memory cells having least two high-spin polarization magnetic material junctions which are separated from one another by electron trap site defect containing insulator. The two terminal bistable memory cells demonstrate stable, low current readable, hysteretic resistance states which are set by the flow of a relatively high, (eg. a milliamp or less), plus or minus polarity D.C. current therethrough, which resistance is monitored by lower magnitude A.C. or D.C. current flow therethrough. Preferred cells have at least one $CrO_2/Cr_2O_3/CrO_2$ sequence but typically have multiple $CrO_2/Cr_2O_3/CrO_2$ sequences in series.

5 Claims, 5 Drawing Sheets

APPLICATION OF HIGH SPIN POLARIZATION MATERIALS IN TWO TERMINAL NON-VOLATILE BISTABLE MEMORY DEVICES

This Application Claims benefit of Provisional Application Serial No. 60/290,151; Filed May 11, 2001.

TECHNICAL AREA

The disclosed invention relates to memory devices and more particularly to two terminal bistable memory cells which comprise at least two high-spin polarization magnetic material junctions, said junctions being separated from one another by insulator, said insulator typically containing trap sites; said two terminal bistable memory cell demonstrating two stable, low A.C. or D.C. current readable, hysteretic resistance states which are set by the flow of a relatively higher plus or minus D.C. polarity current therethrough. Preferred cells each comprise at least one sequence of: $CrO_2/Cr_2O_3/CrO_2$.

BACKGROUND

State of the art electronic devices include, for instance, three terminal Complementary Metal Oxide Semiconductor (CMOS) devices which provide fan-in and fan-out capability, and can perform memory and logic functions. Where only memory is required, however, two terminal electrical devices are applicable. Two terminal electrical memory systems are functionally similar to magnetic dipoles which are set to one of two stable states by application of magnetic fields, but they are set by application of voltage/current and are monitored by applying a current/voltage and reading a voltage/current. Two terminal memory devices include Giant magnetoresistive devices as well as tunnel junction based magnetics.

Two terminal devices can operate based on a tunnel magnetoresistance effect and can be comprise a sequence of:
 ferromagnetic/insulator/ferromagnetic;
materials. The resistance across said sequence is determined by the relative magnetic alignment of two ferromagnetic layers. The effect is based in the ability of ferromagnetics to polarize spin in electric currents where Polarization (P) is given by:

$$P=(n+-n-)/(n++n-);$$

where n+ and n− are the number of conduction electrons with their spin parallel and anti-parallel, respectively. It is noted that optimum magneto-electronic properties correspond to a Polarization of 100%. One important candidate for 100% spin polarization is Chromium Oxide. Articles which show that $CrO_2$ demonstrates significant magnetoresistance effects are:

"Enhanced Intergrain Tunneling Magnetoresistance in Half-Metallic $CrO_2$ Films", Hwang et al., Science 278, (1998);
 "Magnetoresistance of Chromium Dioxide Powder Compacts", Coey et al., Phys. Rev. Lett., 80, (1998);
 "Extrinsic Giant Magnetoresistance In Chromium (IV) Oxide, $CrO_2$", Manoahran, Appl. Phys. Lett., 72 (1998).

Additional known references which are relevant to non-volatile memory devices which utilize stray magnetic fields generated by currents to switch resistance states include:
 "Double Tunnel Junctions for Magnetic Random Access Memory Devices", Iomata et al., J. Appl. Phys., Vol. 87, No. 9, (May 2000), which describes fabrication of double tunnel junctions which comprise a central ferromagnetic layer prepared by alternate sputter deposition of $Co_{80}Pt_{20}$ and $Al_2O_3$. Where said ferromagnetic layer has top and bottom electrodes made of FeCo applied thereto, room temperature Tunnel Magnetoresistance of 20% was achieved.
 "Exchange-based Magnetic Tunnel Junctions and Application to Nonvolatile Magnetic Random Access Memory", Parkin et al., J. Appl. Phys., Vol. 85, No. 8, (April 1999), describes tunnel junctions comprising two ferromagnetic layers separated by an insulating tunnel barrier. Switching between magnetoresistance states is shown as achieved by application of a magnetic field.
 "Ultrahigh Density Vertical Magnetoresistive Random Access Memory", Jian-Gang Zhu et al., J. Appl. Phys., Vol. 87, No. 9, (May 2000), mentions a ring shaped vertical magnetoresistive random access memory comprised of magnetic tunneling junctions.
 "Spin Dependent Tunneling Devices Fabricated for Magnetic Random Access Memory Applications Using Latching Mode", Wang et al., J. App. Phys., Vol. 87, No. 9 (May 2000); describes Spin Dependent Tunneling Junctions comprising: $NiFeCo/Al_2O_3/CoFe/IrMn$ formed by rf diode sputtering.

Continuing, it is generally accepted that spin polarized current density larger than about $10^7$ A/cm$^2$ is necessary to produce sufficient torque on a magnetic nanoparticle and change its orientation, thus that several Milliamps are required to flip regions in system fabricated by electron-lithography of a typical size of 100×100 nm area. It is also noted that asymetric results occur when positive and negative currents are applied. Articles which provide insight to non-volatile memory devices which operate based on spin transfer from electrons to set hysteretic resistance states are:
 "Magnetization Precession by Hot Spin Injection", Weber et al., Science, 291, (2001) discloses experimental results which demonstrate that electron spins experience a torque when going through a ferromagnetic material. Following Newton's Third Law the electrons produce an opposite effect on the magnetic material and can modify its magnetic orientation;
 "A New Twist for Magnetics", Ralph, Science, Vol. 291, (February 2001), which describes that electric currents can manipulate magnets not only by the well known effect of the translation motion of electrons, say through a wire etc., but that the spin of electrons can be beneficially used as well. This article describes that electrons first passed through a spin filter so that a flow thereof is populated predominately by electrons of the same spin, can specifically affect magnetic states on a less than 1 micron dimension scale, whereas magnetic field effects which are based on stray field effects decay slowly with distance, thereby limiting packing density of dipoles which can be specifically controlled thereby, without affecting nearby dipoles. The use of electron spin then makes possible smaller memory cells, and for devices with dimensions of less than 100 nm, electron spin becomes the dominate effect;
 "Excitation of Spin Waves by an Electric Current", Slonczewski, J. Magn. Magn. Matter, 195, (1999);
 "Emission of Spin Waves by a Magnetic Multilayer Traversed by a Current", Berger, Phys. Rev. B 54, (1996);
 "Excitation of a Magnetic Multilayer by an Electric Current", Tsoi et al., Phys. Rev. Lett 80, (1998);

"Current-Induced Magnetization Reversal in Magnetic Nanowires", Wegrowe et al., Europhys. Lett. 45, (1999);

"Current-Induced Switching of Domains in Magnetic Multilayer Devices", Myers et al., Science 285, (1999);

"Spin-Polarized Current Switching of a Co Thin Film Nanomagnet", Albert et al., Appl. Phys. Lett. 77, (2000);

"Spin-Polarized Current Induced Switching in Co/Cu/Co Pillars", Grollier et al., Appl. Phys. Lett. 78, (2001).

"Current-Driven Switching of Magnetic Layers", Heide et al., Phys. Rev. B, Vol. 63, (2001);

"Current-Driven Magnetic Switching in Manganite Trilayer Junctions", Sun, J. of Magnetism and Magnetic Materials, 202 (1999);

"Current Hysteresis Due to Changes in Magnetization of Magnetic Tunnel Junctions by Spin-Polarization Current", Baranov, Europhys. Lett. 53 (5) (2001).

A great many papers report research into materials which provide bi-stable memories. The following are representative:

"Current-Driven Insulator-Conductor Transition and Nonvolatile Memory in Chromium-Doped $SrTiO_3$ Single Crystals", Watanabe et al., J. App. Phys., Vol 78, No. 23, (June 2001), which describes non-volatile memory comprised of Chromium doped $SrTiO_3$ single crystals in which D.C. current flow induced reversible insulator-conduction transition of up to five orders of magnitude, and "Reproducible Switching Effect in Thin Oxide Films for Memory Applications", Beck et al., Appl. Phys. Lett. 77 (2000).

With the present invention in mind, a Search of Patents provided:

U.S. Pat. No. 6,069,820 to Inomata et al. describes a Spin Dependent Conduction Device. This Patent describes a sequence of:

Tunnel Junction—Ferromagnetic Layer—Tunnel Junction wherein a ferromagnetic material is sandwiched between tunneling junctions.

U.S. Pat. No. 5,841,692 to Gallagher et al. describes a magnetic tunneling junction device with antiferromagnetically coupled pinned layer.

U.S. Pat. No. 5,650,958 to Gallagher et al. describes a magnetic tunnel junction with controlled magnetic response.

U.S. Pat. No. 5,966,012 to Parkin describes a Magnetic tunnel junction device with improved fixed and free ferromagnetic layers.

U.S. Pat. No. 5,089,991 to Matthews describes a non-volatile memory cell which operates based on the Hall effect.

U.S. Pat. No. 6,166,948 to Parkin et al. describes a magnetic memory array with magnetic memory tunnel junctions.

U.S. Pat. No. 6,226,160 to Gallagher et al. describes a small area magnetic tunnel junction devices with low resistance and high magnetoresistance.

U.S. Pat. No. 6,215,695 to Ikeda describes a magnetoresistance element for application in memory.

U.S. Pat. No. 6,233,172 to Chen et al. describes a magnetic element with dual magnetic states.

U.S. Pat. No. 5,856,897 to Mauri describes a self-biased dual spin valve sensor.

U.S. Pat. No. 5,953,248 to Chen et al. describes a low switching field magnetic tunneling junction for use in high density arrays.

U.S. Pat. No. 6,215,696 to Tsuge describes a ferromagnetic tunnel junction device and method for its forming.

U.S. Pat. No. 6,178,112 to Bessho et al. describes a ferromagnetic material split by a spacer which comprises a magnetic material and a semiconductor material, the magnetic state of which can be set by application of a stimulus, such as a current flow.

Even in view of the cited references, there remains need for improved non-volatile two-terminal bistable memory systems, and methods of sensing states set therein.

DISCLOSURE OF THE INVENTION

The disclosed invention system can broadly be described as comprising a functional combination of:

a two-terminal static memory cell comprised of at least two junctions between magnetic materials, which junctions demonstrate electron spin preference tunneling; said memory cell being characterized in that application of a positive or negative D.C. voltage across the two terminals thereof causes preferred spin electron flow therethrough, thereby resulting in the setting of a monitorable resistance state therein, the utility being that at least two resistance states can be set by application of different polarity voltages; and a means for sequentially applying D.C. state setting, and D.C. or A.C. sensing voltages/currents, said means for applying D.C. or A.C. sensing voltages/currents including means for monitoring D.C. or A.C. current/voltage.

Said disclosed invention two terminal memory cell is formed from ferro-magnetic and antiferro-magnetic materials, with the preferred ferro-magnetic and antiferro-magnetic materials being $CrO_2$ and an insulator $Cr_2O_3$, respectively, which $CrO_2$ and $Cr_2O_3$ can both be formed by oxidization of chromium to form $Cr/CrO_2(Cr_2O_3)$, or by vacuum deposition, (eg. sputtering), etc. thereby providing $CrO_2/Cr_2O_3/CrO_2$ sequences.

Present invention two-terminal static memory cells enable setting one or another stable state therein by the application of a D.C. voltage/current level of positive or negative polarity across said two terminals thereof. The stable state set is readable by application of a smaller A.C. or D.C. voltage/current in combination with monitoring current/voltage level caused thereby. Note specifically that the disclosed invention can be monitored by D.C. or A.C. a current flow magnitude response to a small applied D.C. or A.C. voltage, or by monitoring a D.C. or A.C. voltage response to an applied small D.C. or A.C. current.

A method of the disclosed invention involves providing a disclosed invention static memory cell as described above, then setting it into one or another stable state by the application of a D.C. voltage level in a range of D.C. voltages, and then monitoring or retrieving said set stable state by application of an A.C. or D.C. voltage in combination with monitoring current flow level caused thereby. Of course said method can include resetting the stable state and repeating the described procedure. When an array of said static memory cells are present and each is involved in practice of the method, it should be appreciated that a digital memory function, functionally essentially transparent to that enabled by multiple dipole cell providing magnetic media, is enabled.

The writing function can involve application of Pulse Voltage which "Imprints" the cell, and said writing can occur in as short a time as 100 nanoseconds in cells sized on the order of 100 nm.

The disclosed invention can then be described as a two terminal bistable memory cell comprising at least two high-spin polarization magnetic material junctions, said junctions being separated from one another by insulator, said two terminal bistable memory cell demonstrating at least two stable hysteretic resistance states; said hysteretic resistance states being set by application of positive or negative D.C. current flow therethrough, wherein the insulator is $Cr_2O_3$ and the high-spin polarization magnetic material junctions are formed by contact with thereof with $CrO_2$.

The disclosed invention can generally be described as a two terminal bistable memory cell comprised of at least two high-spin polarization magnetic material junctions, each thereof being formed by ferromagnetic material in contact with the insulator. Further, said insulator material is typically formed to contain trap site defects, and in fact the presence of trap site defects alters the resistance states achievable.

Investigation of fabricated disclosed invention two terminal bistable memory cells have shown that they are characterized in that:

application of a voltage of about a millivolt or less across one $CrO_2/Cr_2O_3/CrO_2$ sequence causes change in zero bias kilo-ohm range resistance of at least ten percent;

application of a magnetic field substantially cancels the difference in observed resistance states effected by sequential application of positive/negative or negative/positive D.C. current flow; and heating the memory cell to a temperature in excess of the Curie temperature of the magnetic material re-establishes the memory cell capability to be set to two stable hysteretic resistance states by application of positive or negative D.C. current flow therethrough.

A general presently disclosed method of setting and erasing memory comprising the steps of:

a. providing a two terminal bistable memory cell comprising at least two high-spin polarization magnetic material junctions, said junctions being separated from one another by insulator, said two terminal bistable memory cell demonstrating at least two stable hysteretic resistance states; said hysteretic resistance states being set by application of positive or negative D.C. current flow therethrough;

b. by applying a D.C. voltage across said series of at least two high-spin polarization magnetic material comprising junctions, causing a D.C. current to flow therethrough, thereby setting a resistive memory state in said memory cell;

c. monitoring the resistance across said series of at least two of said at least two high-spin polarization magnetic material junctions by application of a resistance determining A.C. or D.C. current flow therethrough;

d. applying a magnetic field to said at least two high-spin polarization magnetic material junctions to erase the memory state set in step b.

Said general method of setting and erasing memory can further comprises the steps of:

e. heating said two terminal bistable memory cell to the Curie temperature of said at least two high-spin polarization magnetic material comprising junctions;

f. by applying a D.C. voltage across said series of at least two high-spin polarization magnetic material comprising junctions, causing a D.C. current to flow therethrough, thereby setting a memory state in said memory cell;

g. monitoring the resistance across said series of at least two of said at least two high-spin polarization magnetic material junctions.

Said general method of setting and erasing memory can further comprise, as an initial step, the heating of said two terminal bistable memory cell to the Curie temperature of said at least two high-spin polarization magnetic material comprising junctions to prepare the system for use as a memory device.

This can be followed by lowering the temperature of the two terminal bistable memory cell to below 250 degrees Kelvin.

A specific presently disclosed method of setting and monitoring memory, comprises the steps of:

a. providing a two terminal bistable memory cell comprising at least two high-spin polarization magnetic material junctions, said junctions being formed between $CrO_2$ and $Cr_2O_3$ in at least one sequence of $CrO_2/Cr_2O_3/CrO_2$, said two terminal bistable memory cell demonstrating at least two stable hysteretic resistance states, said hysteretic resistance states being set by application of positive or negative D.C. current flow therethrough;

b. by applying a D.C. voltage across said series of at least two junctions formed between $CrO_2$ and $Cr_2O_3$, causing a D.C. current to flow therethrough thereby setting a resistive memory state in said memory cell;

c. monitoring the resistance across said series of at least two of said at least two junctions formed between $CrO_2$ and $Cr_2O_3$, by causing an A.C. or D.C. current to flow therethrough.

Said presently disclosed specific method of setting and monitoring memory can further comprise the steps of:

causing a D.C. current to flow therethrough, thereby setting a resistive memory state in said memory cell; and monitoring the resistance across said series of at least two of said at least two junctions formed between $CrO_2$ and $Cr_2O_3$ by flowing an A.C. or D.C. current therethrough;

wherein the D.C. current which sets the resistive memory state which is at least an order of magnitude larger than is the resistance monitoring A.C. or D.C. current.

Said presently disclosed specific method of setting and monitoring memory can further comprise the step of:

d. applying a magnetic field to said at least two high-spin polarization magnetic material junctions to erase the memory state set in step b.

Said presently disclosed specific method of setting and monitoring memory can further comprise the steps of:

e. heating said junctions in said two terminal bistable memory cell to the magnetic material $CrO_2$ Curie temperature of about 400 degrees Centigrade;

f. by applying a D.C. voltage across said series of at least two junctions formed between $CrO_2$ and $Cr_2O_3$, causing a D.C. current to flow therethrough thereby setting a resistive memory state in said memory cell;

g. monitoring the resistance across said series of at least two junctions formed between $CrO_2$ and $Cr_2O_3$ by flowing an A.C. or D.C. current therethrough.

Said presently disclosed specific method of setting and erasing memory can comprise, as an initial step, the heating of said two terminal bistable memory cell to the Curie temperature of said at least two junctions which comprise $CrO_2$.

It is to be understood that a multiplicity of presently disclosed conventional two terminal bistable memory cells can be fashioned into an array and accessed as are conventional known arrays of two terminal bistable memory cells.

It is also to be understood that while $CrO_2/Cr_2O_3/CrO_2$ is, described herein as comprising two junctions, namely $CrO_2/$ $Cr_2O_3$ and $Cr_2O_3/CrO_2$, the $CrO_2/Cr_2O_3/CrO_2$ system is often simply refered to as "a junction". There is no technical distinction implied by the language adopted in this Disclosure, but said language is adopted only to make clear the $Cr_2O_3$ separates two regions of $CrO_2$ which are junctioned to it, from one another.

Finally, it is emphasized that while hysteretic resistance states are set by applying voltage across the terminals of a disclosed invention cell, spin polarized current caused to flow through high-spin polarization magnetic material junctions is what is effective in setting of resistance states in a disclosed inventions cell. Microstructural defect sites, field ionization of electron traps as well as spin-transfer models present explanation for the results achieved. Further, it is noted that where $CrO_2/Cr_2O_3/CrO_2$ systems are involved, the basis of operation is believed to be based in that the $Cr_2O_3$ comprises trap site defects, (eg. $Cr^{3+}$ and/or $Cr^{4+}$), each said trap site defect being comprised of at least two domains, which "domains" are caused to be set either parallel or antiparallel to one another depending on the polarity of the applied D.C. hysteretic resistance setting positive or negative polarity D.C. current flow. When the trap site defect domains are caused to be aligned parallel by application of the positive or negative polarity D.C. voltage, one hysteretic resistance state is set, and where the trap site defect domains are caused to be aligned anti-parallel by application of the negative or positive D.C. voltage, the other hysteretic resistance state is set.

For insight, it is noted that stray magnetic field non-volatile memory devices are typically tunnel magneto-resistance systems, while spin transfer non-volatile memory devices are typically comprised of multiple metallic layers. The disclosed invention is a hybrid of the two in that tunnel junctions are formed between non-insulator magnetic material, (eg. $CrO_2$), and trap defect containing insulator, (eg. $Cr_2O_3$).

The disclosed invention will be better understood by reference to the Detailed Description Section of this Specification.

SUMMARY OF THE INVENTION

It is therefore a general objective and/or purpose of the described invention to disclose two terminal bistable memory cells comprising at least two high-spin polarization magnetic material to insulator junctions, said junctions being separated from one another by said insulator, said two terminal bistable memory cells demonstrating at least two stable hysteretic resistance states; said hysteretic resistance states being set by application of positive or negative D.C. current flow therethrough.

It is a specific objective and/or purpose of the described invention to disclose two terminal bistable memory cells comprising at least two high-spin polarization magnetic material to insulator junctions, said junctions being separated from one another by said insulator, said two terminal bistable memory cells demonstrating at least two stable hysteretic resistance states; said hysteretic resistance states being set by application of positive or negative D.C. current flow therethrough; wherein the insulator is $Cr_2O_3$ and the high-spin polarization magnetic material junctions are formed by contact with thereof with $CrO_2$, and in which said insulator are present electron trap site defects.

It is another objective and/or purpose of the described invention to disclose that, while not limiting, junctions between $Cr_2O_3$ and $CrO_2$ can be formed by oxidation of chromium or vacuum deposition etc.

Other objectives and/or purposes will become apparent by a reading of the Specification and Claims.

DETAILED DESCRIPTION

Figure 1:
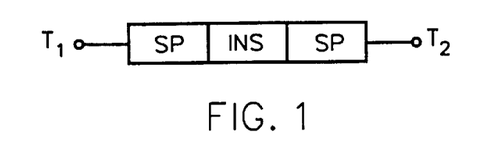
FIG. 1 demonstrates a single sequence of a general disclosed invention having two high-spin polarization magnetic material junctions (SP) separated by an insulator (INS).
Figure 2:
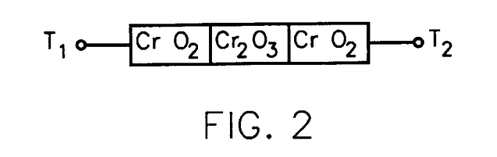
FIG. 2 demonstrates the preferred single sequence of the disclosed invention, indicating a region of $Cr_2O_3$ bounded by junctions to $CrO_2$ on either side thereof.
Figure 3:
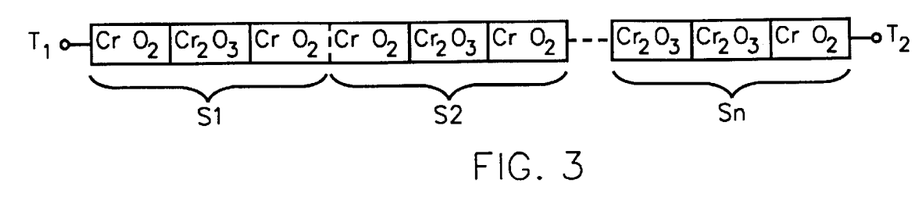
FIG. 3 shows a sequence of "N" units ((S1), (S2) ... (Sn)) of the disclosed invention sequences of $CrO_2/Cr_2O_3/CrO_2$.

Turning now to FIG. 1, there is demonstrated a single sequence of a general disclosed invention having two high-spin polarization magnetic material junctions (SP) separated by an Insulator (INS). FIG. 2 demonstrates the preferred single sequence of the disclosed invention, indicating a region of $Cr_2O_3$ bounded by junctions to $CrO_2$ on either side thereof. FIG. 3 shows a sequence of "N" units ((S1), (S2) . . . (Sn), of the disclosed invention sequences of $CrO_2/Cr_2O_3/CrO_2$. Each "Cell" in FIGS. 1–3 is shown with Terminals (T1) and (T2) present.

A memory array is comprised of a multiplicity of individually accessible cells such as shown in FIG. 1–FIG. 3, which are situated parallel to one another.

Figure 4:
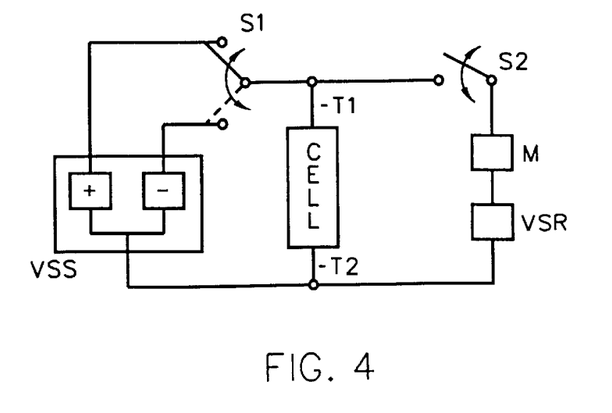
FIG. 4 demonstrates a system for setting a resistance state in a Cell comprising a source of positive and negative polarity voltage (VSS), and a switch (S1), as well as a system for monitoring the resistance state set comprising a voltage source (VSR), meter (M) and switch (S2).

FIG. 4 demonstrates:

a system for setting a resistance state in a Cell, via Terminals (T1) and (T2), said system comprising a source of positive and negative polarity D.C. voltage (VSS), and a switch (S1);

as well as a system for monitoring the resistance state set via Terminals (T1) and (T2), comprising an A.C. or D.C. voltage source (VSR), meter (M) and switch (S2). (Note that Switch (S2) is shown to aid understanding of function, and is actually not required).

Typically the (VSS) + and − D.C. voltages will be between a about 50 millivolts and a volt, depending on if one or about 10 disclosed invention sequences of $CrO_2/Cr_2O_3/CrO_2$ are present in a Cell. That is, about a millivolt or less per $CrO_2/Cr_2O_3/CrO_2$ sequence is provided by (VSS) to set resistance states thereof. The (VSR) source provides on the order of an order of magnitude lower A.C. or D.C. voltage.

Figure 5:
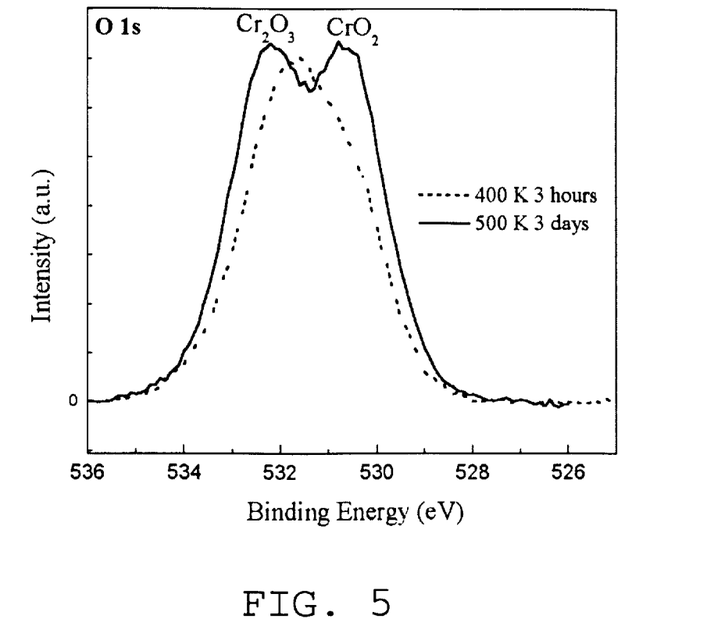
FIG. 5 shows an X-ray photoemission (XPS) spectrum obtained from a disclosed invention fabrication via oxidation of chromium. Note the indication of the presence of peaks indicating the presence of both $CrO_2/Cr_2O_3$.

FIG. 5 shows an X-ray photoemission (XPS) spectrum obtained from a disclosed invention fabricated via oxidation of chromium in an $O_2$ atmosphere. Note the indication of the presence of both $CrO_2/Cr_2O_3$ when the process is continued at 500 degrees Kelvin for three days. This shows that it is possible to fabricate $CrO_2/Cr_2O_3/CrO_2$ cells at temperatures compatible with those utilized in semiconductor fabrication procedures.

Figure 6:
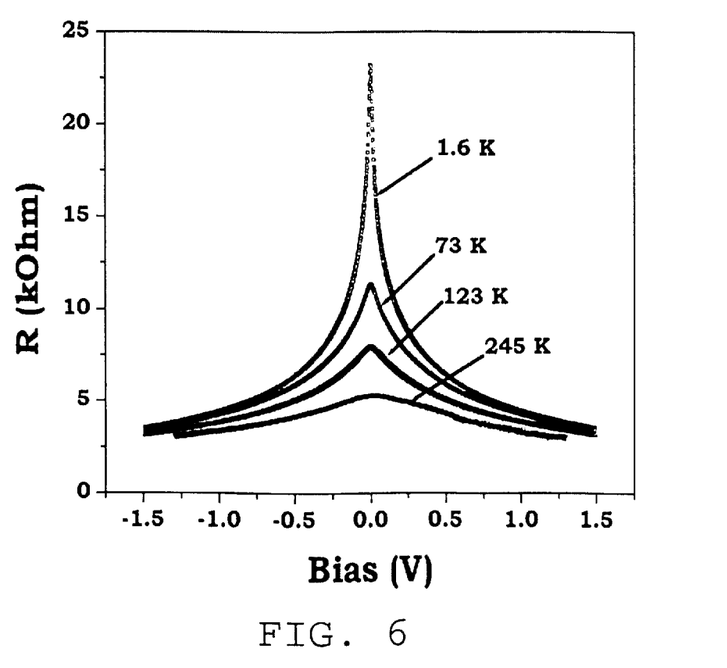
FIG. 6 shows disclosed invention Resistance vs. Negative and Positive Bias Voltage, as a function of Temperature.

FIG. 6 shows disclosed invention Resistance vs. Negative and Positive Bias Voltage, as a function of Temperature for a $CrO_2/Cr_2O_3/CrO_2$ comprising two terminal memory junction device.

Figure 7A:
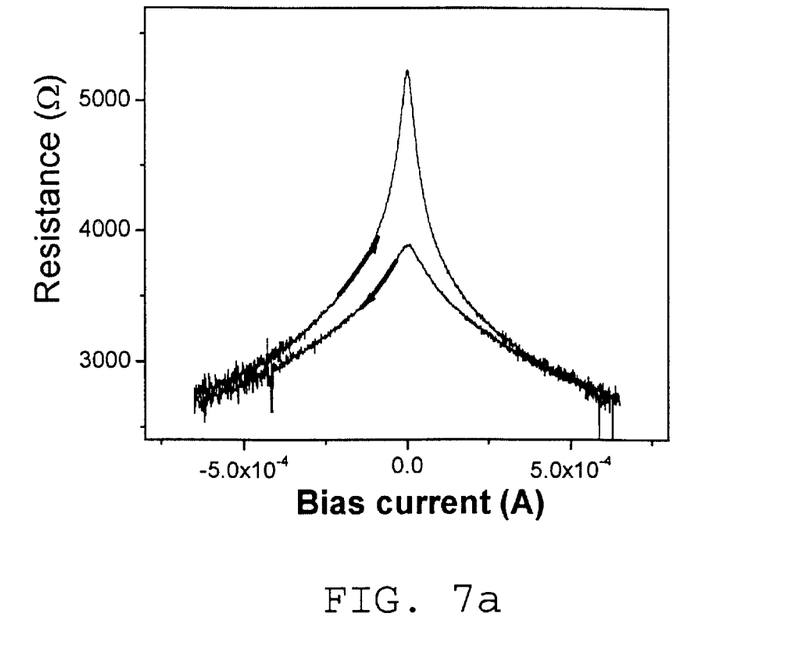
FIG. 7a shows disclosed invention Resistance vs. Bias Current for a $CrO_2/Cr_2O_3/CrO_2$ comprising two terminal memory junction device.
Figure 7B:
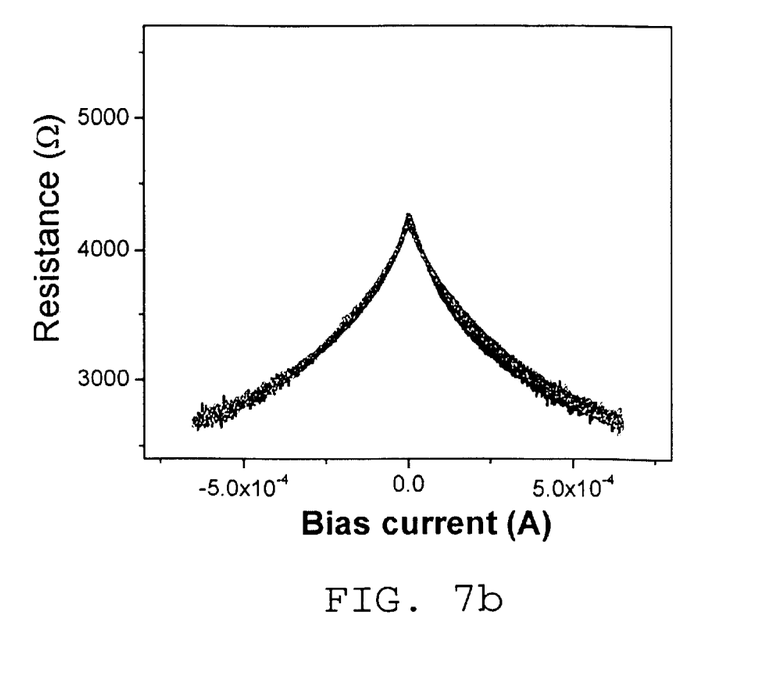
FIG. 7b shows the results of FIG. 7a are canceled by application of a Magnetic field.

FIG. 7a shows disclosed invention Resistance vs. Negative and Positive Bias Current for a $CrO_2/Cr_2O_3/CrO_2$ comprising two terminal memory junction device. FIG. 7b shows the results of FIG. 7a are canceled by application of a Magnetic field.

Figure 8:
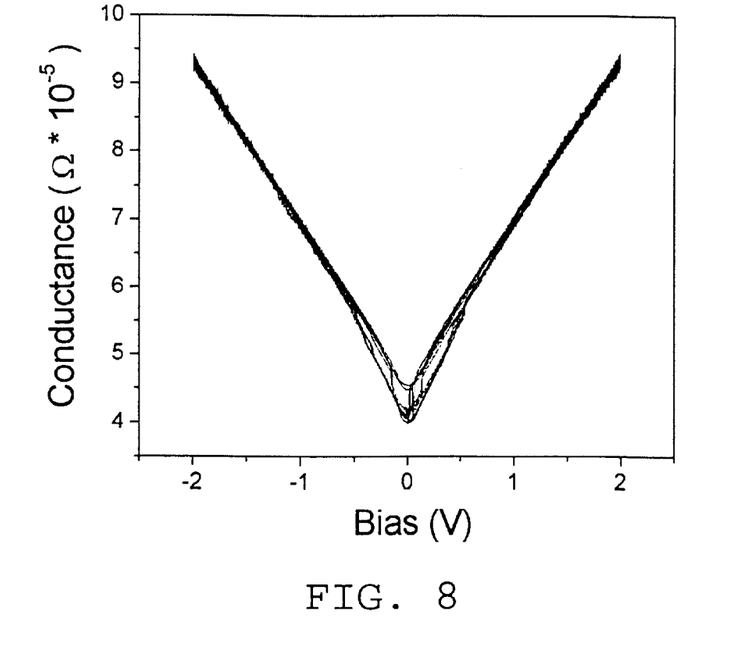
FIG. 8 shows Conductance vs. Bias Voltage, indicating resistive hysteresis for a $CrO_2/Cr_2O_3/CrO_2$ comprising two terminal memory junction device.

FIG. 8 shows Conductance vs. Negative and Positive Bias Voltage, indicating resistive hysteresis for a $CrO_2/Cr_2O_3/CrO_2$ comprising two terminal memory junctions device.

Figure 9:
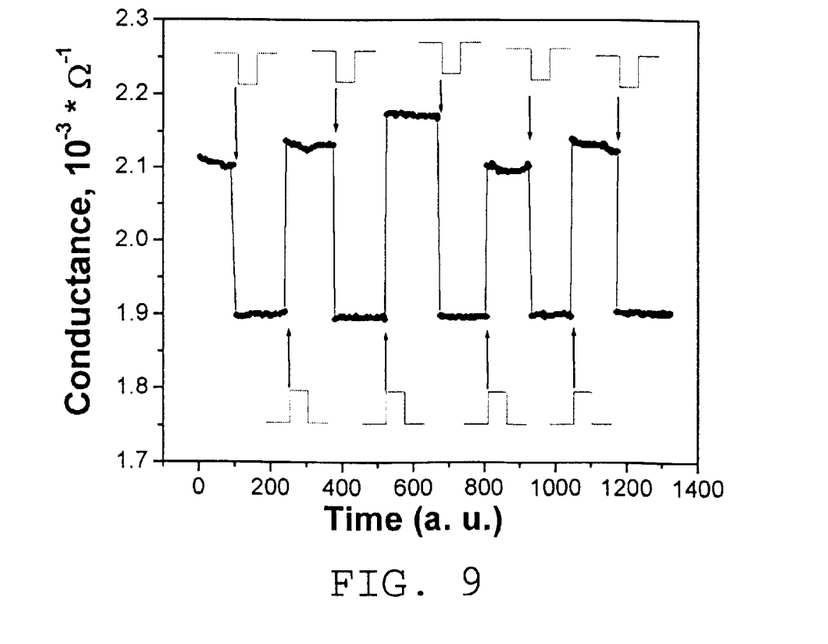
FIG. 9 shows Conductance vs. Time as a function of 100 nsec. applied resistive state setting pulses for a $CrO_2/Cr_2O_3/CrO_2$ comprising two terminal memory junction device.

FIG. 9 shows Conductance vs. Time as a function of 100 nsec. applied hysteretic resistance state setting pulses for a $CrO_2/Cr_2O_3/CrO_2$ comprising two terminal memory junction device.

Figure 10:
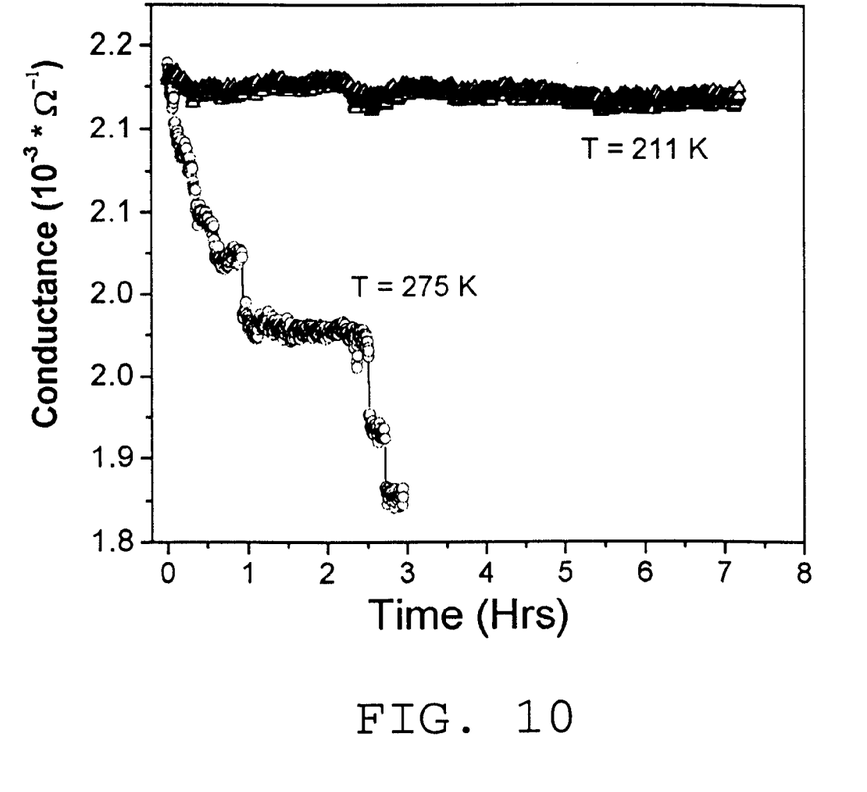
FIG. 10 shows Conductance of a set state lifetime vs. Time, as a function of Temperature for a $CrO_2/Cr_2O_3/CrO_2$ comprising two terminal memory junction device.

FIG. 10 shows Conductance of a set state lifetime vs. Time, as a function of Temperature for a $CrO_2/Cr_2O_3/CrO_2$ comprising two terminal memory junction device. Note that increased temperature shortens the lifetime of the memory retention.

Again, it is to be understood that while $CrO_2/Cr_2O_3/CrO_2$ is described herein as comprising two junctions, namely $CrO_2/Cr_2O_3$ and $Cr_2O_3/CrO_2$ the $CrO_2/Cr_2O_3/CrO_2$ system is often simply refered to by those skilled in the art as "a junction". There is no technical distinction implied by the language adopted in this Disclosure. Said language is adopted only to make clear the $Cr_2O_3$ separates two regions of $CrO_2$ which are "junctioned" to it, from one another.

It is emphasized that, while applying voltage causes a current to flow, it is current flow through high-spin polarization magnetic material junctions, (eg. $CrO_2/Cr_2O_3$), which it is believed effects setting of resistance states in a disclosed invention cell. Further, the resistance values are believed to be achieved by aligning domains to be parallel or anti-parallel in the presence of trap site defects in the insulator, (eg. $Cr_2O_3$).

Having hereby disclosed the subject matter of the present invention, it should be obvious that many modifications, substitutions, and variations of the present invention are possible in view of the teachings. It is therefore to be understood that the invention may be practiced other than as specifically described, and should be limited in its breadth and scope only by the Claims.

We claim:

1. A method of setting and erasing memory comprising the steps of:
   a. providing a two terminal bistable memory cell comprising at least two high-spin polarization magnetic material comprising junctions, said junctions being separated from one another by insulator, said two terminal bistable memory cell demonstrating at least two stable hysteretic resistance states; said hysteretic resistance states being set by application of positive or negative D.C. current flow therethrough;
   b. by applying a D.C. voltage across said at least two high-spin polarization magnetic material comprising junctions, causing a D.C. current to flow therethrough, thereby setting a resistive memory state in said memory cell;
   c. monitoring the resistance across said series of at least two of said at least two high-spin polarization magnetic material comprising junctions by application of a resistance determining A.C. or D.C. current flow therethrough;
   d. applying a magnetic field to said at least two high-spin polarization magnetic material junctions to erase the memory state set in step b.

2. A method of setting and erasing memory as in claim 1, which comprises as an initial step the heating of said two terminal bistable memory cell to a Curie temperature of said magnetic material in said at least two high-spin polarization magnetic material comprising junctions.

3. A method of setting and erasing memory as in claim 1, which further comprises the steps of:
   e. heating said two terminal bistable memory cell to a Curie temperature of the magnetic material of said at least two high-spin polarization magnetic material comprising junctions;
   f. by applying a D.C. voltage across said series of at least two high-spin polarization magnetic material comprising junctions, causing a D.C. current to flow therethrough, thereby setting a memory state in said memory cell;
   g. monitoring the resistance across said series of at least two of said at least two high-spin polarization magnetic material comprising junctions.

4. A method of setting and erasing memory as in claim 1, wherein the step of providing a two terminal bistable memory cell comprising at least two high-spin polarization magnetic material comprising junctions, involves providing junctions formed-between $CrO_2$ and $Cr_2O_3$ in a sequence of $CrO_2/Cr_2O_3/CrO_2$.

5. A method of setting and erasing memory as in claim 4, which comprises as an initial step lowering the temperature of the two terminal bistable memory cell to below 250 degrees Kelvin.

* * * * *